(12) United States Patent
Chen et al.

(10) Patent No.: US 6,849,131 B2
(45) Date of Patent: Feb. 1, 2005

(54) TRUNCATED DUMMY PLATE FOR PROCESS FURNACE

(75) Inventors: Yen-Hsing Chen, Nantou (TW); Hsing-Jui Lee, Hsin Chu (TW); Fu-Kuo Tseng, Junghe (TW); Ching-Ling Lee, Hsinchu (TW); Kuo-Hung Liao, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 237 days.

(21) Appl. No.: 10/264,492

(22) Filed: Oct. 5, 2002

(65) Prior Publication Data

US 2004/0065261 A1 Apr. 8, 2004

(51) Int. Cl.[7] .................. C23C 16/00; C23C 16/455
(52) U.S. Cl. .................. 118/715; 118/724; 118/725
(58) Field of Search ............... 118/715, 724, 118/725, 728, 729, 730

(56) References Cited

U.S. PATENT DOCUMENTS

| | | | | |
|---|---|---|---|---|
| 5,112,641 A | * | 5/1992 | Harada et al. | 438/542 |
| 5,279,670 A | * | 1/1994 | Watanabe et al. | 118/725 |
| 5,310,339 A | * | 5/1994 | Ushikawa | 432/253 |
| 5,688,116 A | * | 11/1997 | Kobayashi et al. | 432/12 |
| 5,690,742 A | * | 11/1997 | Ogata et al. | 118/500 |
| 5,820,683 A | * | 10/1998 | Ishii et al. | 118/728 |
| 6,156,121 A | * | 12/2000 | Hasebe et al. | 118/500 |
| 6,341,935 B1 | * | 1/2002 | Tseng | 414/800 |
| 6,344,387 B1 | * | 2/2002 | Hasebe et al. | 438/240 |
| 6,589,599 B1 | * | 7/2003 | Conte et al. | 427/250 |
| 6,686,281 B2 | * | 2/2004 | Yamazaki et al. | 438/680 |
| 2002/0014311 A1 | * | 2/2002 | Tometsuka | 156/345 |
| 2003/0077920 A1 | * | 4/2003 | Noda et al. | 438/788 |
| 2004/0065261 A1 | * | 4/2004 | Chen et al. | 118/728 |

FOREIGN PATENT DOCUMENTS

| | | | |
|---|---|---|---|
| JP | 6-120311 | * | 6/1994 |
| JP | 2001-291670 A | * | 10/2001 |
| KR | 2001-018597 A | * | 10/2001 |

* cited by examiner

Primary Examiner—Jeffrie R. Lund
(74) Attorney, Agent, or Firm—Tung & Associates

(57) ABSTRACT

A truncated dummy plate which is suitable for promoting substantially uniform flow of process gases among all regions on the surface of a substrate to facilitate deposition of a film having uniform thickness on the substrate. The truncated dummy plate has a circular shape with a flat edge provided in the curved edge of the dummy plate. At least two, and preferably, about three or four of the dummy plates are positioned in the sites on a wafer boat which are in relatively close proximity to a gas outlet in a process furnace typically during a LPCVD process carried out in the furnace. The flat or truncated edges of the dummy plates are disposed on the gas inlet side of the process chamber, with the round edges of the dummy plates disposed on the gas outlet side of the process chamber.

8 Claims, 2 Drawing Sheets

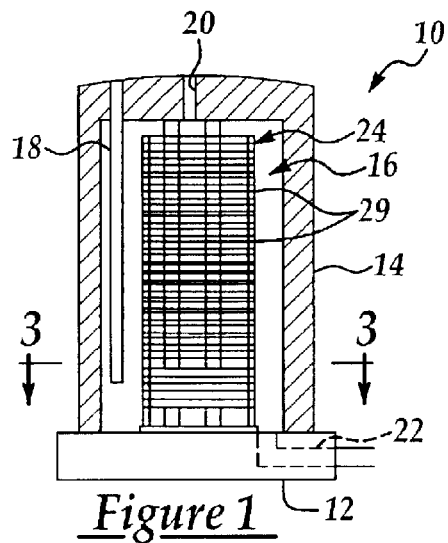
Figure 1
Prior Art
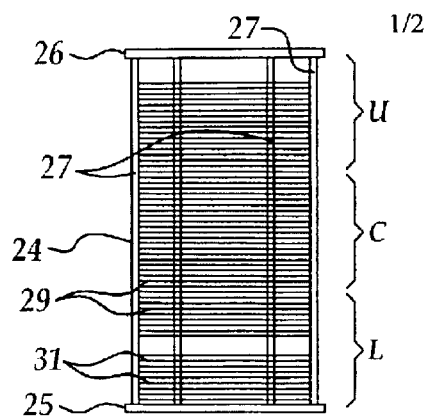
Figure 2
Prior Art
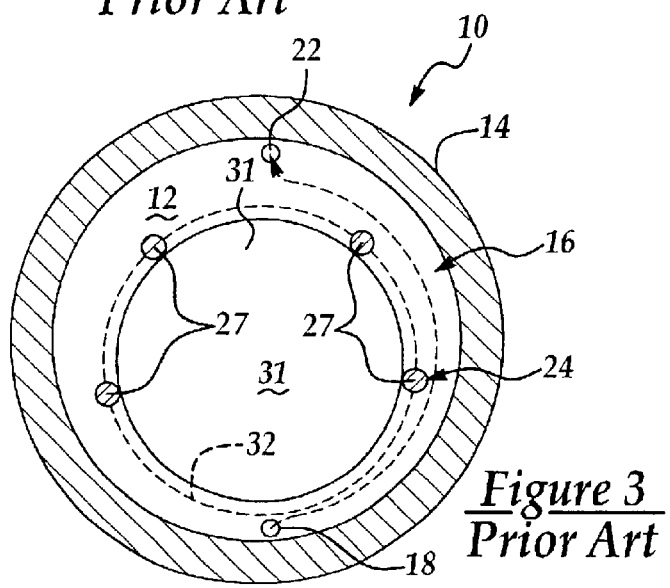
Figure 3
Prior Art
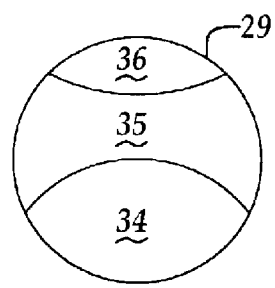
Figure 4
Prior Art
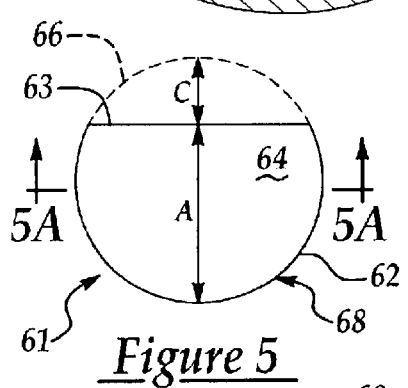
Figure 5
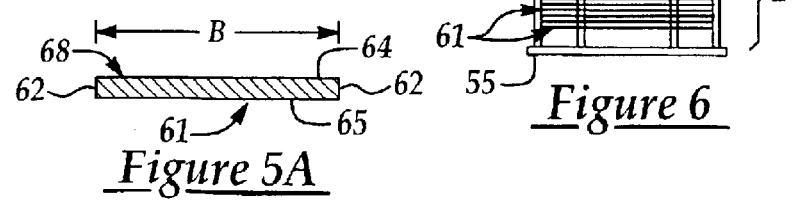
Figure 5A
Figure 6

TRUNCATED DUMMY PLATE FOR PROCESS FURNACE

FIELD OF THE INVENTION

The present invention relates to furnaces used in the fabrication of semiconductor integrated circuits on semiconductor wafer substrates. More particularly, the present invention relates to dummy plates having a modified shape for providing uniform gas flow and heating of wafers in a process chamber, particularly a LPCVD (low pressure chemical vapor deposition) furnace.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of conductive and insulative films on the wafer be reduced by a degree which corresponds to shrinkage of the circuit features in the lateral dimension. Ultrathin device features will become increasingly essential for the fabrication of semiconductor integrated circuits in the burgeoning small/fast device technology.

Chemical vapor deposition (CVD) processes are widely used to form layers of materials on a semiconductor wafer. CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both. Other CVD processes include APCVD (atmospheric pressure chemical vapor deposition), and LPCVD (low pressure chemical vapor deposition). While APCVD systems have high equipment throughput, good uniformity and the capability to process large-diameter wafers, APCVD systems consume large quantities of process gas and often exhibit poor step coverage. Currently, LPCVD is used more often than APCVD because of its lower cost, higher production throughput and superior film properties. LPCVD is commonly used to deposit nitride, TEOS oxide and polysilicon films on wafer surfaces for front-end-of-line (FEOL) processes.

A typical conventional vertical LPCVD furnace is generally indicated by reference numeral 10 in FIG. 1 and includes a base 12 on which is removably mounted a quartz tube 14. The interior of the quartz tube 14 defines a reaction chamber 16 for processing of as many as 150 substrates 29 held by a wafer boat 24 that is supported on the base 12 and contained in the reaction chamber 16. The wafer boat 24 may be a SiC (silicon carbide) wafer boat and, as shown in FIG. 2, typically includes a base plate 25 and a top plate 26 which are spanned by multiple vertical support rods 27. The substrates 29 are supported in vertically-spaced relationship by slots (not shown) in the support rods 27.

A gas inlet tube 18 may extend downwardly through the quartz tube 14 into the reaction chamber 16, and a central gas inlet opening 20 may be provided in the top center of the quartz tube 14, for distributing reaction gases into the reaction chamber 16. A gas outlet 22 is provided typically in the base 12 for distributing exhaust gases from the reaction chamber 16. The gas outlet 22 may be located on the opposite side of the wafer boat 24 with respect to the gas inlet tube 18 to facilitate a more uniform flow of the reaction gases throughout the reaction chamber 16. Multiple circular dummy plates 31 may be provided in the bottom portion of the wafer boat 24 to further promote a uniform flow of the reaction gases 32, particularly in the bottom portion of the reaction chamber 16 which is the closest to the gas outlet 22, as shown in FIG. 3.

During LPCVD processes carried out in the conventional furnace 10, as many as 150 substrates 29 are processed in batches in order to maintain high wafer throughput. The substrates 29 in the upper sites (designated by the letter "U" in FIG. 2) and the substrates 29 in the center sites (designated by the letter "C" in FIG. 2) of the wafer boat 24 are substantially uniformly coated with deposition material, which forms films of uniform thickness, due to substantially uniform distribution of the reaction gases 32 along the surfaces of the substrates 29 in the upper sites "U" and the center sites "C". However, at the lower sites "L", the reaction gases 32 tend to flow in lesser volumes on the gas inlet tube 18 side than on the gas outlet 22 side of the reaction chamber 16. Consequently, due to the proximity of the substrates 29 in the lower sites "L" in the wafer boat 24 to the gas outlet 22, those substrates 29 tend to be coated with deposition material in various thicknesses along various regions on the surface of the substrate 29, as shown in FIG. 4, with the heaviest-coated region 34 of each substrate 29 located on the side of the wafer boat 24 closest to the gas inlet tube 18 and the lightest-coated region 36 on the substrate 29 located on the side of the wafer boat 24 closest to the gas outlet 22. A medium-coated region 35 is formed on the substrate 29 between the heaviest-coated region 34 and the lightest-coated region 36. Due to this disparity in film thickness among the various regions on the substrate 29, the L sites on the wafer boat 24 typically remain vacant during the LPCVD process. Consequently, each batch of substrates 29 typically contains only about 100 substrates, consisting of the substrates 29 in the U sites and the C sites, instead of the 150-wafer batch capacity. This reduces wafer throughput and processing efficiency.

It has been found that modifying the shape of the dummy plate to a truncated configuration provides a more uniform gas flow path and temperature profile within substrates located in the lower sites on the wafer boat. Consequently, the thickness uniformity of chemical vapor material deposited among the entire surface of the substrates in the lower sites of the wafer boat is substantially enhanced. Thickness uniformity on the wafers in the L-sites of the wafer boat have been improved from 4.2%, in the case of LPCVD processes which utilize the circular dummy plates, to 1.8%, in the case of LPCVD processes which utilize the truncated dummy plates of the present invention. CPK values for the U/C/L sites was improved from 1.9 to 3.3.

Accordingly, an object of the present invention is to provide a new and improved dummy plate for processing of substrates.

Another object of the present invention is to provide a new and improved dummy plate which facilitates enhanced thickness uniformity in film thickness among all regions on a substrate during CVD processes.

Still another object of the present invention is to provide a new and improved dummy plate which increases substrate throughput during semiconductor processing.

Yet another object of the present invention is to provide a new and improved dummy plate which promotes uniformity in process gas distribution among all regions on a substrate positioned in relatively close proximity to an exhaust gas outlet in a semiconductor processing furnace or chamber.

A still further object of the present invention is to provide a dummy plate which has a truncated configuration for the uniform distribution of process gases in a LPCVD chamber.

Yet another object of the present invention is to provide a method of promoting a substantially uniform flow of process gases along all regions on the surface of a substrate to facilitate formation of a film having a substantially uniform thickness among the regions on the substrate.

A still further object of the present invention is to provide a truncated dummy plate which is capable of increasing the batch size or number of substrates in a semiconductor fabrication process.

SUMMARY OF THE INVENTION

In accordance with these and other objects and advantages, the present invention is generally directed to a truncated dummy plate which is particularly suitable for promoting substantially uniform flow of process gases among all regions on the surface of a substrate to facilitate deposition of a film having uniform thickness on the substrate. The truncated dummy plate has a generally circular shape with a flat edge provided in the curved edge of the dummy plate. At least two, and preferably, about three or four of the dummy plates are positioned in the sites on a wafer boat which are in relatively close proximity to a gas outlet in a process furnace typically during a LPCVD process carried out in the furnace. The flat or truncated edges of the dummy plates are disposed on the gas inlet side of the process chamber, with the round edges of the dummy plates disposed on the gas outlet side of the process chamber. The truncated shape of the dummy plates promotes a more uniform flow of the process gases over the surfaces of substrates positioned in the wafer boat in proximity to the gas outlet, resulting in deposition of material films having a substantially uniform thickness among all regions on the surfaces of the substrates.

BRIEF DESCRIPTION OF THE DRAWINGS

The invention will now be described, by way of example, with reference to the accompanying drawings, in which:

FIG. 1 is a sectional view of a typical conventional LPCVD process furnace suitable for implementation of the present invention;

FIG. 2 is a front view of a typical conventional wafer boat loaded with a batch of multiple substrates and six conventional circular dummy plates;

FIG. 3 is a cross-sectional view, taken along section lines 3—3 in FIG. 1, of a conventional process furnace, illustrating use of the process furnace in conjunction with conventionally-shaped dummy plates;

FIG. 4 is a top view of a substrate deposited with a material film of variable thickness resulting from use of the conventionally-shaped dummy plates in an LPCVD furnace;

FIG. 5 is a top view of an illustrative embodiment of a truncated dummy plate of the present invention;

FIG. 5A is a cross-sectional view, taken along section lines 5A—5A in FIG. 5, of a truncated dummy plate of the present invention;

FIG. 6 is a front view of a conventional wafer boat shown holding multiple substrates and three truncated dummy plates of the present invention;

DESCRIPTION OF THE PREFERRED EMBODIMENTS

Figure 7:
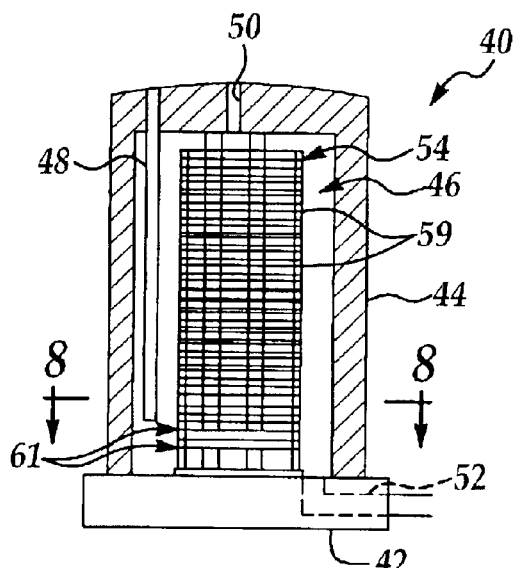
FIG. 7 is a sectional view of a typical conventional LPCVD process furnace in implementation of the present invention.

The present invention includes a truncated dummy plate which promotes substantially uniform flow of process gases among all regions on the surface of a substrate to facilitate deposition of a film having uniform thickness on the substrate. At least two, and preferably, about three of the dummy plates are positioned in the sites on a wafer boat which are in relatively close proximity to a gas outlet in a process chamber, typically a LPCVD furnace, during a LPCVD process carried out in the furnace. The truncated shape of the dummy plates promotes a more uniform flow of the process gases over the surfaces of substrates positioned in the wafer boat in proximity to the gas outlet, resulting in deposition of material films having a substantially uniform thickness among all regions on the surfaces of the substrates.

Referring to FIG. 5, a truncated dummy plate 61 of the present invention includes a plate body 68 having a curved edge 62 and a flat edge 63 which interrupts the curvature of the curved edge 62. The plate body 68 includes a top surface 64 and a bottom surface 65, as shown in FIG. 5A. As shown in FIG. 5, in a preferred embodiment the maximum distance "A" between the curved edge 62 and the flat edge 63 is typically about 15 cm, whereas the maximum width "B" of the dummy plate 61, as shown in FIG. 5A, is typically about 20 cm. However, it is understood that the dummy plate 61 may have dimensions "A" and "B" which are larger or smaller than those described above, depending on the desired application of the dummy plates 61. In the preferred embodiment of FIG. 5, the dummy plate 61 may be formed by fabrication of a circular plate and removing a portion 66 from the plate to define the flat edge 63, in which case the removed portion 66 has a maximum width "C" of about 5 cm.

Figure 8:
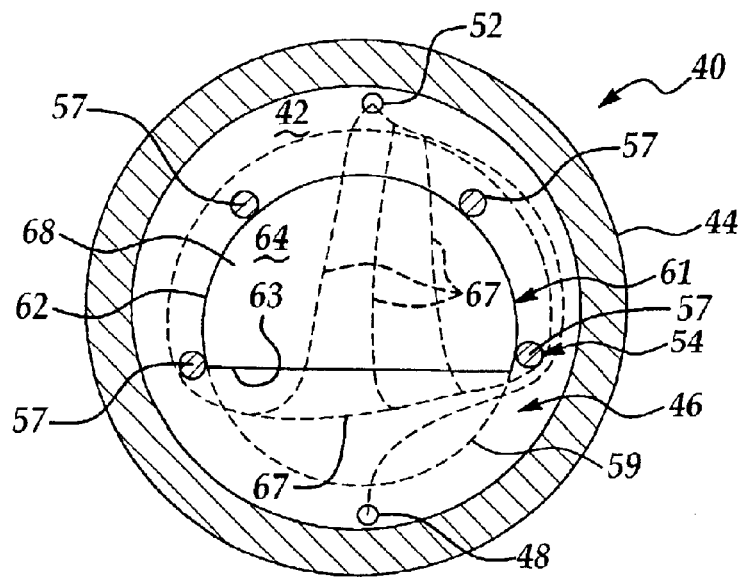
FIG. 8 is a cross-sectional view, taken along section lines 8—8 in FIG. 7, of a conventional process furnace, illustrating use of the process furnace in conjunction with the truncated dummy plates of the present invention.

Referring next to FIGS. 6–8, in application of the dummy plates 61, a wafer boat 54 is used to support multiple substrates 59 in a process chamber such as an LPCVD furnace 40 as an LPCVD process is carried out in the furnace 40. The wafer boat 54 may be a conventional SiC (silicon carbide) wafer boat and typically includes a base plate 55 and a top plate 56 which are spanned by multiple vertical support rods 57. The substrates 59 are supported in vertically-spaced relationship by slots (not shown) in the support rods 57. However, it is understood that the wafer boat may have alternative designs as is known in the art.

The LPCVD furnace 40 typically includes a base 42 on which is removably mounted a quartz tube 44. The interior of the quartz tube 44 defines a reaction chamber 46 for processing of as many as 150 substrates 59 held by the wafer boat 54 as the wafer boat 54 is supported on the base 42 and contained in the reaction chamber 46. A gas inlet tube 48 may extend downwardly through the quartz tube 44 into the reaction chamber 46, and a central gas inlet opening 50 may be provided in the top center of the quartz tube 44, for distribution of reaction gases 67 into the reaction chamber 46. A gas outlet 52 is provided typically in the base 42 for distributing the reaction gases 67 from the reaction chamber 46. The gas outlet 52 is typically located on the opposite side of the wafer boat 54 with respect to the gas inlet tube 48 to facilitate a more uniform flow of the reaction gases 67 throughout the reaction chamber 46. It is understood that the foregoing description of the LPCVD furnace 40 is illustrative only and is not intended to limit the scope of the invention. The present invention is equally suitable for use with substrate processing chambers or furnaces having designs which depart from that heretofore described with respect to the LPCVD furnace 40.

In accordance with the present invention, at least two, and preferably, three of the truncated dummy plates 61 of the present invention are positioned typically in the bottom portion, or lower sites "L", as shown in FIG. 6, of the wafer boat 54, which bottom portion is usually the portion of the wafer boat 54 that is in closest proximity to the gas outlet 52, as shown in FIG. 7. The dummy plates 61 are inserted in the slots (not shown) provided in the support rods 57 of the wafer boat 54. As shown in FIG. 8, the flat or truncated edge 63 of each truncated dummy plate 61 faces the gas inlet tube 48 side of the reaction chamber 46, whereas the curved edge 62 of each truncated dummy plate 61 faces the gas outlet 52 side of the reaction chamber 46. Multiple substrates 59 to be processed in the LPCVD furnace 40 are loaded in the upper sites "U", the center sites "C" and most of the lower sites "L" of the wafer boat 54. After the wafer boat 54, loaded with the substrates 59 and the truncated dummy plates 61, is placed in the reaction chamber 46 of the furnace 40, the LPCVD process is carried out typically using standard LPCVD process parameters by introducing reaction gases 67 into the reaction chamber 46 through the gas inlet tube 48 and the gas inlet opening 50.

Figure 9:
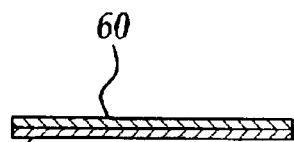
FIG. 9 is a cross-sectional view of a substrate after being subjected to a LPCVD process in implementation of the present invention.

During the LPCVD process carried out in the reaction chamber 46, the reaction gases 67 flow in a substantially uniform path over the surfaces of the substrates 59 in the upper sites "U" and the substrates 59 in the center sites "C" of the wafer boat 54. Consequently, the substrates 59 in the upper sites "U" and in the center sites "C" are substantially uniformly coated with deposition material, which forms films of uniform thickness on the surfaces of those substrates 59. As the reaction gases 67 traverse the reaction chamber 46 to the gas outlet 52, a substantial volume of the reaction gases 67 tends to bypass the surfaces of the substrates 59 in the lower sites "L". However, the truncated shape of the truncated dummy plates 61 facilitates flow of a greater volume of the reaction gases 67 across the surface of the substrates 61 positioned in the lower sites "L" of the wafer boat 54, and this promotes a substantially uniform flow of the reaction gases 67 across the surfaces of those substrates 61, resulting in deposition of a material film 60 which is substantially uniform in thickness across the entire surface of each substrate 61, as shown in FIG. 9. Consequently, prior to the LPCVD process, the maximum batch number of substrates 59 may be loaded into the wafer boat 54, wherein each batch may contain as many as 150 of the substrates 54. This substantially enhances throughput and processing efficiency of the substrates 54.

Referring again to FIG. 6, it is understood that the truncated dummy plates 61 may alternatively be positioned in the upper sites "U" of the wafer boat 54, as shown in phantom, or alternatively, in the center sites "C" of the wafer boat 54, in the event that the design of the particular process chamber or furnace being used for substrate processing causes a higher volume of flow of the process gases on one side of the reaction chamber than on the other side of the reaction chamber in these areas of the chamber or furnace.

While the preferred embodiments of the invention have been described above, it will be recognized and understood that various modifications can be made in the invention and the appended claims are intended to cover all such modifications which may fall within the spirit and scope of the invention.

What is claimed is:

1. A system for promoting substantially uniform flow of a reaction gas in a semiconductor fabrication process, comprising:

a reaction chamber having a gas inlet side, a gas outlet side disposed generally opposite said gas inlet side, a gas inlet provided on said gas inlet side and a gas outlet provided on a gas outlet side;

a wafer boat for positioning in said reaction chamber; and at least two dummy plates for positioning in said wafer boat adjacent to said gas outlet, each of said at least two dummy plates comprising a truncated plate body having a curved edge and a flat edge shaped in said curved edge of said plate body, with said flat edge of said at least two dummy plates disposed on said gas inlet side of said reaction chamber.

2. The system of claim 1 wherein a maximum distance between said curved edge and said flat edge is about 15 cm.

3. The system of claim 1 wherein said truncated plate body has a maximum width of about 20 cm.

4. The system of claim 3 wherein a maximum distance between said curved edge and said flat edge is about 15 cm.

5. The system of claim 1 wherein said at least two dummy plates comprises three dummy plates.

6. The system of claim 5 wherein a maximum distance between said curved edge and said flat edge is about 15 cm.

7. The system of claim 5 wherein said truncated plate body has a maximum width of about 20 cm.

8. The system of claim 7 wherein a maximum distance between said curved edge and said flat edge is about 15 cm.

\* \* \* \* \*